United States Patent [19]

Obigane

[11] Patent Number: 5,278,494
[45] Date of Patent: Jan. 11, 1994

[54] WAFER PROBING TEST MACHINE
[75] Inventor: Tadashi Obigane, Kofu, Japan
[73] Assignee: Tokyo Electron Yamanashi Limited, Nirasaki, Japan
[21] Appl. No.: 836,870
[22] Filed: Feb. 19, 1992
[30] Foreign Application Priority Data Feb. 19, 1991 [JP] Japan .................................. 3-24417

[51] Int. Cl.⁵ .............................................. G01R 31/02
[52] U.S. Cl. .............................. 324/158 F; 324/158 P
[58] Field of Search ............................ 324/158 F, 158 P, 158 R, 73.1

[56] References Cited

U.S. PATENT DOCUMENTS

| | | | |
|---|---|---|---|
| 4,775,281 | 10/1988 | Prentakis | 414/416 |
| 4,943,767 | 7/1990 | Yokota | 324/158 F |
| 4,950,982 | 8/1990 | Obikane | 324/158 R |
| 5,077,523 | 12/1991 | Blanz | 324/158 P |
| 5,084,671 | 1/1992 | Miyata et al. | 324/158 F |
| 5,086,270 | 2/1992 | Karasawa et al. | 324/158 F |

FOREIGN PATENT DOCUMENTS

| | | | |
|---|---|---|---|
| 0073644 | 4/1987 | Japan | 324/158 P |
| 0081941 | 4/1988 | Japan | 324/158 P |
| 0010640 | 1/1989 | Japan | 324/158 P |
| 0101476 | 4/1989 | Japan | 324/158 P |
| 2270341 | 11/1990 | Japan | 324/158 P |

*Primary Examiner*—Ernest F. Karlsen
*Attorney, Agent, or Firm*—Oblon, Spivak, McClelland, Maier & Neustadt

[57] ABSTRACT

A wafer probing test machine including a loading/unloading section defined by a first frame to enclose plurality of cassette stages therein, a test section defined by a second frame for enclosing a test stage therein, an elevator for moving at least one of the cassette stages up and down, and a wafer transfer system having a multi-jointed arm for taking out the wafer from a cassette and transferring the wafer onto the test stage.

5 Claims, 4 Drawing Sheets

WAFER PROBING TEST MACHINE

BACKGROUND OF THE INVENTION

1. Field of the Invention

The present invention relates to a wafer probing test machine for testing each of the pads on a semiconductor wafer chip and more particularly, relates to an improvement of the wafer transfer system for transferring the wafer between a cassette stage and a test stage.

2. Description of the Related Art

In the course of testing wafers of semiconductor devices, pads of the wafer chip are contacted with probes to test or examine whether or not the electric circuit on each chip is disconnected and also to test electric characteristics of each chip. The wafer probing test machine (or wafer prober) is used for this wafer test.

The wafer prober includes a test section and loading/unloading section. The test section includes a test stage and a probe card. A plurality of probes are planted on the probe card and each of the probes is electrically connected to a tester.

The wafers are carried one by one from the loading/unloading section into the test section and the pads on each semiconductor wafer chip are contacted with the probes. A signal is applied from the tester to the electric terminals to check whether or not the electrical circuit on the chip is disconnected.

In the case of the conventional wafer probers, the place where the wafers are taken out from and returned into the cassette is located on the body frame of the prober because this outside place makes it easy to handle wafers and cassettes. According to this conventional wafer prober, the wafer cassette is mounted on an elevator at the loading/unloading section. While intermittently lifting the elevator at a certain pitch, the wafer is picked up by a pincette (or vacuum holding) system. The wafer thus took out is then carried into the test section defined by the body frame.

As the circuit on each of the semiconductor devices is integrated more and more, it is necessary that the atmosphere around the wafers be made cleaner because the existence of particles adhering to any of the wafers make them faulty. It has been therefore been attempted that the atmosphere in the clean room be kept as clean as possible and that particles caused by the machine itself be kept as few as possible.

In the case of the conventional wafer probers, however, the wafer take-out/return place is located outside of the machine, that is, on the body frame of the machine. This makes it difficult to prevent particles also caused by operators' behaviors around the wafers from adhering to the wafers.

On the other hand, the cleanliness in the clean room can be made extremely high by improving the flow of atmosphere in the clean room and enhancing the capacity of filters used. However, the clean room thus built so high in its construction and maintenance costs as to make it impractical or not economical.

SUMMARY OF THE INVENTION

The object of the present invention is therefore to provide a wafer probing test machine capable of preventing members, such as semiconductor wafers to be tested, from being contaminated at a lower cost and with higher efficiency.

According to one aspect of the present invention, this object of the present invention can be achieved by a wafer probing test machine comprising a loading/unloading section defined by a first frame to enclose a plurality of cassette stages therein; a test section defined by a second frame to enclose a test stage; an elevator means for moving at least one of the cassettes up and down; and a wafer transfer means having an expansion arm for taking out wafers one by one from the cassette and transferring them one by one directly or indirectly onto the test stage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DESCRIPTION OF THE PREFERRED EMBODIMENTS

Some embodiments of the present invention will now be described in detail with reference to the accompanying drawings.

Figure 1:
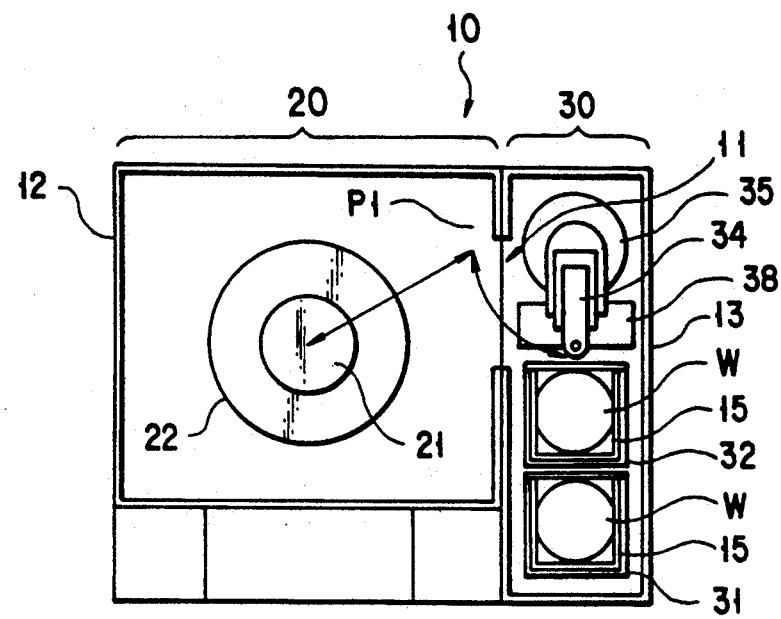
FIG. 1 is a top plan view, showing the layout of the each of sections in the wafer probing test machine according to a first embodiment of the present invention.

As shown in FIG. 1, a wafer prober 10 has a test section 20 and a loading/unloading section 30. Each of sections 20, 30 is made as an independent unit. Sections 20 and 30 are enclosed by their corresponding frames 12 and 13 and each of them has an exhaust system (not shown) located under it. An opening 11 is formed at a side at which both of the frames 12 and 13 are contacted with each other, and the sections 20 and 30 are communicated with each other through the opening 11.

A wafer chuck 21 is located substantially in the center of the test section 20. It has a system (not shown) for holding a semiconductor wafer W in a vacuum sucked manner and it is mounted on a stage 22 which is provided with an X-Y-Z-$\theta$ mover system (not shown).

Figure 2:
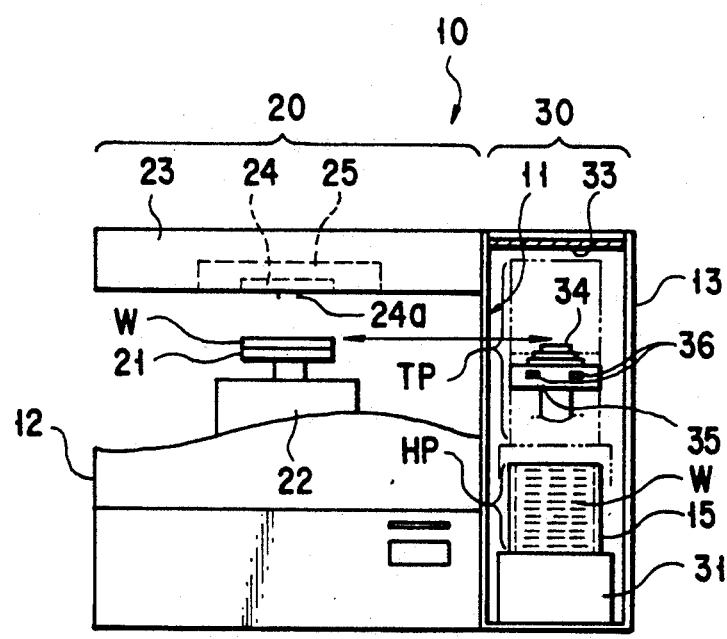
FIG. 2 is a partly- and vertically-sectional view, viewed from front, showing the test section and the loading/unloading section in the wafer probing test machine.

As shown in FIG. 2, a head plate 23 is located, facing the top of the wafer chuck 21. A probe card 24 is held at the center of the lower portion of the head plate 23. A plurality of probes 24a are planted on the probe card 24. Each of the probes 24a is electrically connected to a test head (not shown) through an insert ring 25. When the chuck 21 is lifted by the X-Y-Z-$\theta$ stage 22, the probes 24a on the probe card 24 are contacted with pads of chips on the wafer W.

The loading/unloading section 30 houses two elevators 31, 32, a pre-alignment system 38 and a transfer system 35. An upper door 33 is attached, to the top of the frame 13 which defines the loading/unloading section 30. This upper door 33 is located right above the elevators 31 and 32. The transfer system 35 is located adjacent to the opening 11 and has an arm 34 for taking out the wafer W from the cassette. The pre-alignment system 38 has a rotating system and optical detector (not shown) for aligning the orientation flat (O.F.) of the wafer W in a predetermined direction.

The elevators 31 and 32 are connected to a lifter system (not shown) which is provided with a ball screw and a stepping motor. Each of the elevators 31 and 32 has a stroke which is between its home position HP and up to a position above the upper door 33. The first elevator 31 is located at a position a little remote from the transfer system 35 while the second elevator 32 at a position adjacent to the transfer system 35.

When the first and second elevators 31 and 32 are at their wafer transfer position TP, their height is the same as that of the opening 11. Namely, the wafer W can be picked up from and returned into the cassette 15 inside the frame 13 which defines the load/unload section 30.

The wafer cassette 15 is mounted on each of the elevators 31 and 32. Twenty five sheets of 6-inch wafers W are seated horizontally in each of the cassettes 15 at a certain pitch.

The transfer system 35 has plural drive motors (not shown). A multi-joint arm 34 can be moved in X, Y, Z and $\theta$ directions by the drive motors. The multi-joint arm 34 is formed by three links and a wafer holder is attached to the front end of the top one of these links. The wafer holder holds the wafer W vacuum-sucked.

Figure 7:
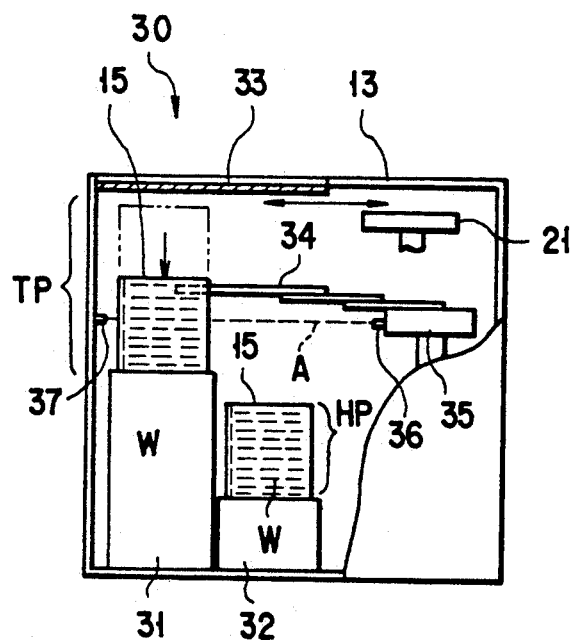
FIG. 7 is a partly- and vertically-sectional view showing the loading/unloading section for explaining how the wafer is taken out of the cassette.

As shown in FIG. 7, the multi-jointed arm 34 can be extended over the second elevator 32 to take out the wafer W from the cassette 15 on the first elevator 31. The cassette 15 on the second elevator 32 is held this time at its home position HP.

Now will be described how a wafer in the cassette 15 can be detected.

Figure 4:
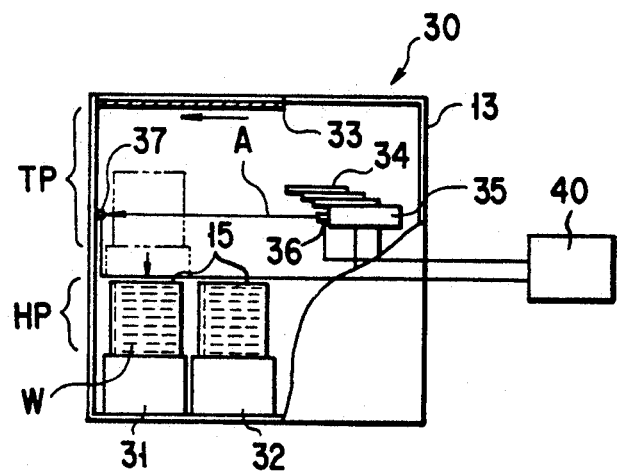

As shown in FIG. 4, a light-emitter 36 of a sensor is opposed to a light-receiver 37 thereof so that light beam A can be shot from the light-emitter 36 to the light-receiver 37. Two sets of these sensors each comprising the light emitter and receiver are so located as to make their light beams A parallel to each other on a horizontal plane. Two pairs of the emitter 36 and receiver 37 are connected to a wafer detector 40 such as microcomputer, respectively.

Figure 5:
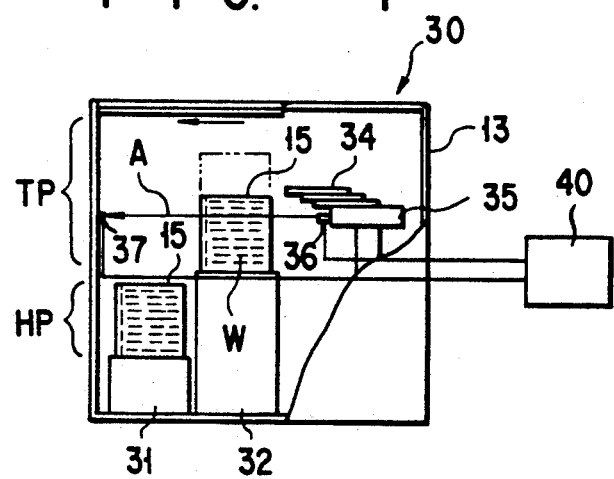

As shown in FIG. 5, the path along which the parallel light beams A advance crosses the wafer transfer position TP. When the cassette 15 is lifted from its home position HP, therefore, the light beams A are shielded by the cassette 15 or the wafer W.

It will be now described how the wafer prober 10 having the above-described arrangement is made operative.

Figure 3:
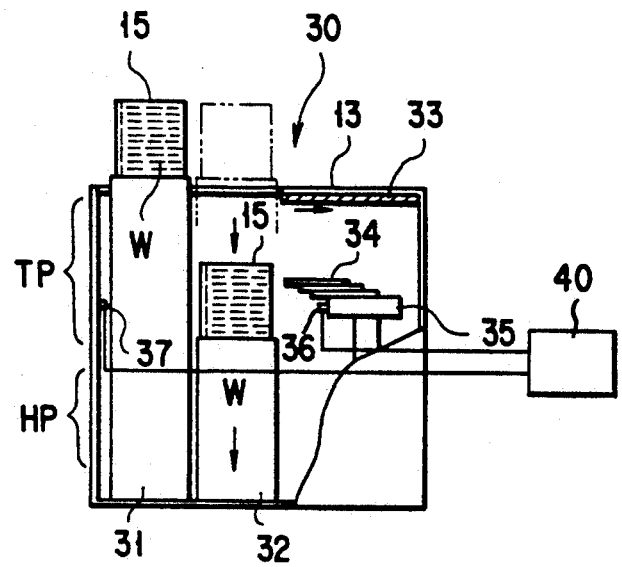
FIGS. 3 through 5 are partly- and vertically-sectional views showing the loading/unloading section to recognize each of wafers in cassettes.

As shown in FIG. 3, the elevators 31 and 32 at the loading/unloading section 30 are lifted to their upper limit and the cassette 15 is mounted on each of the elevators 31 and 32. The door 33 is closed to shield the loading/unloading section 30 from the outside. The second elevator 32 is first lowered to hold its cassette 15 at the home position HP. The first elevator 31 is then lowered to position its cassette 15 at the wafer transfer position TP. While the cassette 15 on the first elevator 31 is being lowered in this manner, the state (position and posture) of each of the wafers W in the cassette 15 is detected by the light sensors. Thereafter, steps will be automatically carried out in closed spaces which are defined by the frames 12 and 13.

Figure 6:
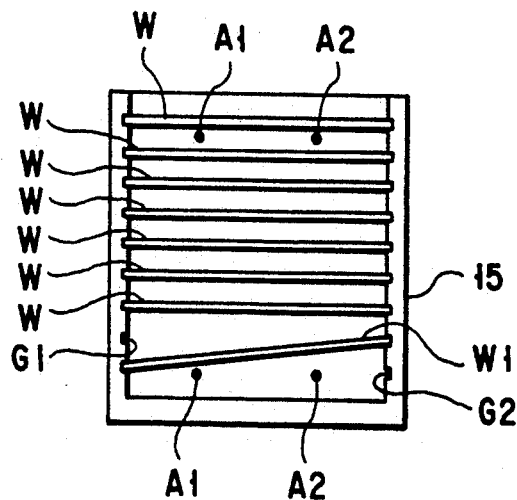
FIG. 6 is a view for explaining how the wafers in a cassette can be recognized.

Referring to FIG. 6, it will be described how the state of each of the wafers W in the cassette 15 can be detected.

When two parallel light beams A1 and A2 are shielded at the same timing by a wafer W, it can be found that this wafer W is in the cassette 15 at its correct position. The timings, at which the parallel light beams A1 and A2 are shielded by a wafer $W_1$, are different from each other, and it can be found that the wafer $W_1$ is not at its correct position in the cassette 15. These findings are made by a computer (not shown). The wafer $W_1$ is held by two different grooves G1 and G2 in the cassette 15, and, for example, when it is found not to be at its correct position, the wafer $W_1$ cannot be taken out of the cassette 15 by the arm 34 of the transfer system.

When all of the wafers in the first cassette 15 are checked regarding their states in this manner, as shown in FIG. 5, the first elevator 31 is lowered to hold the first cassette 15 at the home position HP. The second elevator 32 is then lifted to position the second cassette 15 at the wafer transfer position TP. While lowering the second elevator 32 step by step at a predetermined pitch, the state of each of the wafers W in the second cassette 15 is checked. When all of the wafers W are checked for their states in this manner, the second elevator 32 is lowered so as to hold the second cassette 15 at the home position HP.

As shown in FIG. 7, the first cassette 15 is then lifted to the wafer transfer position TP. The arm 34 is extended over the second cassette 15 to take out the top wafer W from the first cassette 15.

While the wafer holder avoids the wafer $W_1$ which is not at its correct position in the cassette 15, the holder holds only those wafers W, which are at their correct positions, on the basis of results obtained by checking all of the wafers in the cassette 15. When the wafer $W_1$ is not at its correct position in the cassette 15, therefore, the arm 34 and the holder can be prevented from hitting and breaking this wafer $W_1$.

The flat orientation of the wafer W thus picked up is then aligned by the alignment system 38. The arm 34 is swung so as to bring the wafer W to a wafer transfer position P1 in the test section 20. The wafer test stage 22 is moved this time from the center of the test section 20 to the wafer transfer position P1. The arm 34 is lowered and it stops its vacuum suction to transfer the wafer W onto the wafer chuck 21. The test stage 22 is returned to the center of the test section 20 and lifted so as to contact the pads on the wafer W with the probes 24a. A signal is applied from the tester to the probes 24a so as to carry out the probing test. When this test is finished, the wafer a is unloaded from the chuck 21 to the cassette 15 on the first elevator 31.

When the wafer W is returned into the cassette 15 on the first elevator 31 in this manner, the next wafer W is taken out from the same cassette 15 and then tested in the same manner as described above. When all of the wafers W in the first cassette 15 are successively tested in this manner and their testing is finished, the first elevator 31 is lowered to return the cassette 15 to the home position HP.

The second elevator 32 is then lifted so as to bring the second cassette 15 to the wafer transfer position TP. The arm 34 is extended to pick up the top wafer W from the second cassette 15. The wafer W is carried to the transfer position P1 in the test section 20 and transferred onto the chuck 21. The probing test of the wafer W is thereafter carried out in the test section 20.

While lifting the second elevator 32 step by step at the predetermined pitch, the wafers W are picked up one by one from the second cassette 15 and tested successively.

When the testing of all of the wafers W in the two cassettes 15 is finished in this manner, the upper door 33 is opened. The first and second elevators 31 and 32 are lifted to bring their cassettes 15 outside the frame 13. These cassettes 15 in which the tested wafers are housed are replaced by new cassettes.

According to the above-described wafer prober 10, the first and second elevators 31 and 32 enable the wafers W to be picked up one by one from each of the cassettes 15 under such a condition that these cassettes 15 are housed in a space closed and defined by the frame 13. Dust caused by an operator's behavior around the cassettes 15 can be prevented from adhering to the wafers W. The testing of the wafers W can be thus carried out in a cleaner atmosphere.

Breaking of the wafers W by an operators' careless mistake can also be avoided.

Further, the transfer system 34 and the two elevators 31, 32 are aligned on a straight line. The volume of the loading/unloading section 30 can be thus made smaller, thereby enabling the inside of the machine to be made clean in a shorter amount of time.

Furthermore, the state of each of the wafers W in the cassettes 15 are previously recognized by the two parallel light beams A1 and A2. This can prevent the wafer $W_1$ which is not at its correct position in the cassette 15 from being broken by the arm 34 at the pickup time because the arm 34 avoids the wafer $W_1$ according to this previous recognition. In addition, the arm 34 can be extended to pick up only those wafers which are at their correct positions in the cassette 15, while avoiding the wafer $W_1$ and other empty rooms in the cassette 15. This enables the test efficiency of the machine to be increased to a greater extent.

A second embodiment of the present invention will now be described with reference to FIGS. 8 and 9. The components as those of the first embodiment will not be further described in this case.

Figure 8:
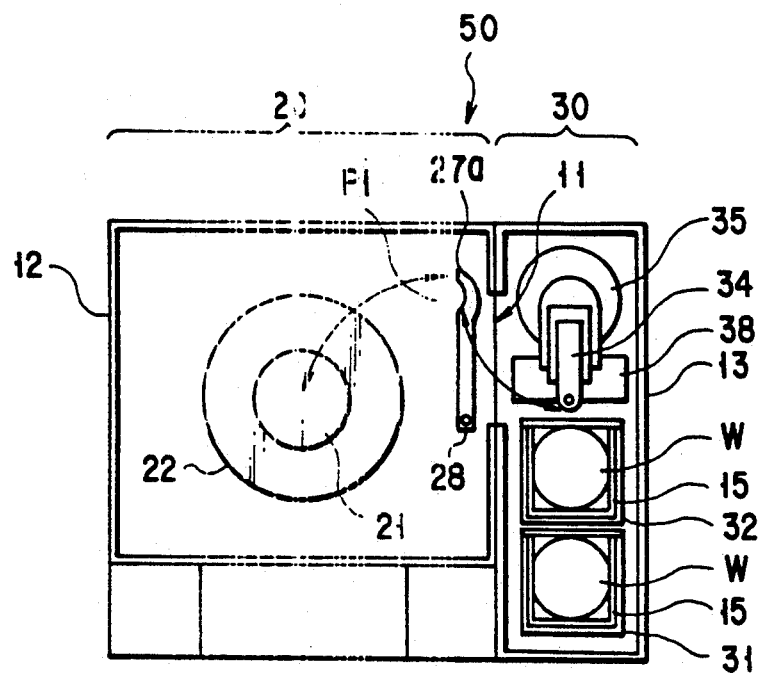
FIG. 8 is a top plan view, showing the layout of each of sections in the wafer probing test machine according to a second embodiment of the present invention.

As shown in FIG. 8, twin arms 27a and 27b are provided at the transfer position P1 in the test section 20 of a wafer prober 50. Each of the twin arms 27a and 27b has a holder for vacuum-sucking the wafer W. They are connected to their corresponding swing drive systems (not shown) through double drive shafts 28.

Figure 9:
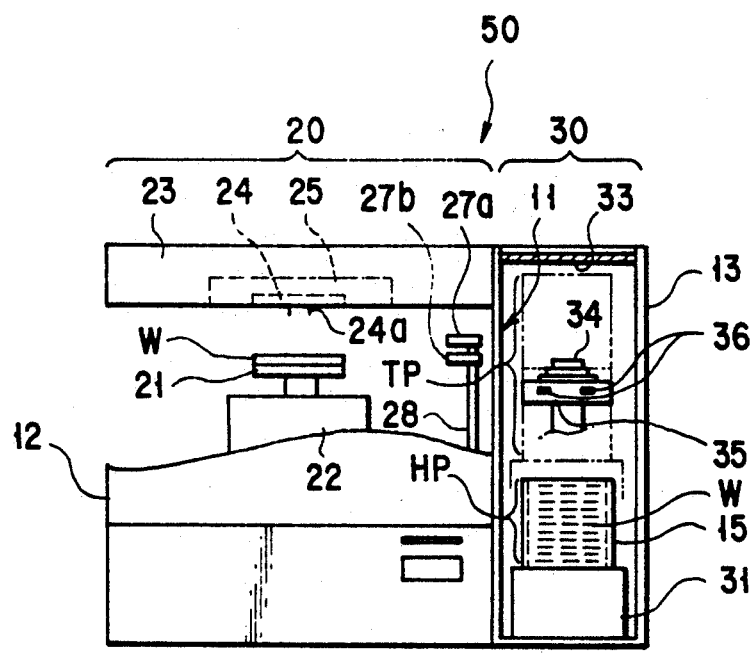
FIG. 9 is a vertically-sectional view, viewed from the front, showing the test section and loading/unloading section in the second wafer probing test machine.

As shown in FIG. 9, the twin arms 27a and 27b are located at the wafer transfer position P1. They are connected to a lifter system (not shown).

According to this wafer prober 50, the wafer W which has been tested can be unloaded from the chuck 21 by the upper arm 27a while bringing the next wafer W which is to be tested onto the chuck 21 by the lower arm 27b. The time during which each of the following wafers must be held ready for the test can be thus made shorter, thereby increasing the throughput of the machine to a greater extent.

According to the test machine of the present invention, the semiconductor wafers can be tested without contaminating them but at a lower cost and with a higher efficiency, as described above.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A wafer probing test machine comprising:
  a loading/unloading section having a first frame enclosing a plurality of cassette stages therein;
  a test section defined by a second frame enclosing a test stage therein;
  an elevator for moving at least one of the cassette stages up and down;
  a wafer transferor having an expansion arm for taking out the wafer form a cassette and transferring the wafer onto the test stage; and
  a door attached to a top portion of the first frame such that in testing operation, said door is opened, followed by moving the cassette stage upward, then loading the cassette on the cassette stage, moving the cassette stage downward, and then closing the door so as to position the cassette within the loading/unloading section.

2. The wafer probing test machine according to claim 1, wherein said elevator is attached to each of the cassette stages.

3. The wafer probing test machine according to claim 1, wherein said test stage has an XY directions mover.

4. The wafer probing test machine according to claim 1, wherein said wafer transfer means has a lifting and swinging member.

5. A wafer probing test machine according to claim 1, wherein said plurality of cassette stages and said wafer transferor are arranged in series in an XY plane within the loading/unloading section, and wherein an opening is provided for taking out the wafer from each cassette, said opening facing toward said wafer transferor.

* * * * *